US006479370B2

(12) United States Patent
Gonzalez et al.

(10) Patent No.: US 6,479,370 B2
(45) Date of Patent: *Nov. 12, 2002

(54) ISOLATED STRUCTURE AND METHOD OF FABRICATING SUCH A STRUCTURE ON A SUBSTRATE

(75) Inventors: Fernando Gonzalez; Chandra Mouli, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 71 days.

(21) Appl. No.: 09/440,406

(22) Filed: Nov. 15, 1999

(65) Prior Publication Data

US 2001/0039100 A1 Nov. 8, 2001

Related U.S. Application Data

(62) Division of application No. 09/022,024, filed on Feb. 11, 1998, now Pat. No. 6,110,998.

(51) Int. Cl.[7] .............................................. H01L 21/76
(52) U.S. Cl. ....................................... 438/439; 438/436
(58) Field of Search ................................ 438/439, 436; 156/643

(56) References Cited

U.S. PATENT DOCUMENTS

| 4,222,792 A | 9/1980 | Lever et al. |
| 4,361,600 A | 11/1982 | Brown |
| 4,407,851 A | 10/1983 | Kurosawa et al. |
| 4,551,743 A | 11/1985 | Murakami .................... 357/50 |
| 4,604,162 A | 8/1986 | Sobczak |
| 4,615,746 A | 10/1986 | Kawakita et al. |
| 4,689,872 A | 9/1987 | Appels et al. |
| 4,735,821 A | 4/1988 | Yamazaki et al. |
| 4,814,287 A | 3/1989 | Takemoto et al. |
| 4,845,048 A | 7/1989 | Tamaki et al. |
| 4,974,060 A | 11/1990 | Ogasawara |
| 5,084,130 A | 1/1992 | Yamazaki et al. |
| 5,176,789 A | 1/1993 | Yamazaki et al. |
| 5,214,603 A | 5/1993 | Dhong et al. |
| 5,331,197 A | 7/1994 | Miyawaki et al. |
| 5,336,629 A | 8/1994 | Dhong et al. |
| 5,453,396 A | 9/1995 | Gonzalez et al. |
| 5,629,539 A | 5/1997 | Aoki et al. |

FOREIGN PATENT DOCUMENTS

| JP | 57-154855 | 9/1982 |
| JP | 57-154856 A | 9/1982 |
| JP | 59-232437 | 12/1984 |
| JP | 60-74452 | 4/1985 |
| JP | 61-201444 | 9/1986 |
| JP | 2-222160 | 9/1990 |
| JP | 3-89532 | 4/1991 |
| JP | 4-302892 | 10/1992 |

Primary Examiner—John F. Niebling
Assistant Examiner—Olivia Luk
(74) Attorney, Agent, or Firm—Kirkpatrick & Lockhart LLP

(57) ABSTRACT

A method of forming an isolated structure of sufficient size to permit the fabrication of an active device thereon is comprised of the steps of depositing a gate oxide layer on a substrate. Material, such as a polysilicon layer and a nitride layer, is deposited on the gate oxide layer to protect the gate oxide layer. An active area is defined, typically by patterning a layer of photoresist. The protective material, the layer of oxide, and finally the substrate are etched to form a trench around the active area. Spacers are formed on the sides of the active area. The substrate is etched to deepen the trench around the active area to a point below the spacers. The substrate is oxidized at the bottom of the trench and horizontally under the active area to at least partially isolate the active area from the substrate. Oxide spacers are formed on the sides of the active area to fill exposed curved oxide regions and the remainder of the trench may be filled with an oxide.

17 Claims, 8 Drawing Sheets

ISOLATED STRUCTURE AND METHOD OF FABRICATING SUCH A STRUCTURE ON A SUBSTRATE

CROSS REFERENCE TO RELATED APPLICATIONS

This application is a divisional of U.S. patent application Ser. No. 09/022,024, filed on Feb. 11, 1998, which is now U.S. Pat. No. 6,110,798, a continuation-in-part of U.S. patent application Ser. No. 08/583,519, filed Jan. 5, 1996.

STATEMENT REGARDING FEDERALLY SPONSORED RESEARCH OR DEVELOPMENT

Not Applicable

BACKGROUND OF THE INVENTION

1. Field of the Invention

The present invention is directed to techniques for fabricating solid state memories and, more particularly, to techniques used in the fabrication of ultra-dense solid state memories.

2. Description of the Background

Techniques for fabricating solid state memories have been commercially available for many years. During that time, there has been, and continues to be, pressure to shrink the size of the individual memory cell so that memories of larger and larger capacity can be fabricated. That pressure has lead to the development of unique components. For example, the trench capacitor and stacked capacitor have been developed. Those components are three-dimensional structures. By fabricating the capacitors in an upward direction, less planar surface of the chip is used thereby permitting a more dense circuit architecture. In such three dimensional components, the edge or vertical portion of the component plays an important role in determining the component's characteristics.

New fabrication techniques must often be developed to enable such unique components to be realized. Preferably, the techniques needed to fabricate such components are developed in such a manner that a manufacturer's existing fabrication equipment can be used so that the expense of purchasing costly new equipment can be avoided, or at least postponed.

The pressure to continually fit more memory cells into a given amount of space has also lead to new circuit architectures. For example, U.S. Pat. No. 5,214,603 discloses a folded bitline, dynamic random access memory cell which utilizes a trench capacitor and a planar-configured access transistor that is stacked over the capacitor.

As components become smaller and are packed closer together, leakage and second order effects become more and more significant. Current circuit architectures fabricated with commercially available techniques, while very capable of producing dense memories, are not capable of being scaled down to the levels needed to produce ultra-dense memories on the order of 256 megabits and higher. Thus, the need exists for a method and circuit architecture for enabling active devices to be fabricated in such a manner that the active devices can be packed in an ultra-dense manner using currently available fabrication equipment.

BRIEF SUMMARY OF THE INVENTION

The present invention is directed to a method of forming a partially isolated structure of sufficient size to permit the fabrication of an active device thereon. The method is comprised of the steps of depositing a gate oxide layer on a substrate. Material, such as a polysilicon layer and a nitride layer, is deposited on the gate oxide layer to protect the gate oxide layer. An active area is defined, typically by patterning a layer of photoresist. The protective material, the layer of oxide, and finally the substrate are etched to form a trench around the active area. Spacers are formed on the sides of the active area. The substrate is etched to deepen the trench around the active area to a point below the spacers. The substrate is oxidized at the bottom of the trench and horizontally under the active area to partially or completely isolate the active area from the substrate. Oxide spacers are formed on the sides of the active area to fill exposed curved oxide regions and the remainder of the trench may be filled with an oxide.

The present invention is also directed to an isolated structure of sufficient size to permit the fabrication of an active device thereon. The structure is comprised of a substrate and a layer of gate oxide carried by the substrate in a manner which defines the area of the isolated structure. The substrate is oxidized under all or a portion of the area defined by the gate oxide at a depth sufficient to enable an active device to be fabricated in an unoxidized portion of the substrate occurring between the gate oxide layer and the oxidized portion of the substrate.

The method and apparatus of the present invention enable active devices to be packed into ultra-dense configurations using currently available fabrication equipment. For example, the present invention may be used to implement 256 megabit or 1 gigabit memories. Additionally, because the diode junctions of active devices are formed in areas of the substrate that are at least partially isolated from the remainder of the substrate, the diode junctions are less leaky. Also, the configuration of the field oxide provides excellent field isolation. Those, and other advantages and benefits of the present invention will become apparent from the Description Of The Preferred Embodiment hereinbelow.

BRIEF DESCRIPTION OF THE SEVERAL VIEWS OF THE DRAWING

For the present invention to be clearly understood and readily practiced, the present invention will be described in conjunction with the following figures wherein:

FIG. 2b is a top view looking down onto the portion of the substrate shown in FIG. 2a;

DETAILED DESCRIPTION OF THE INVENTION

Figure 1:
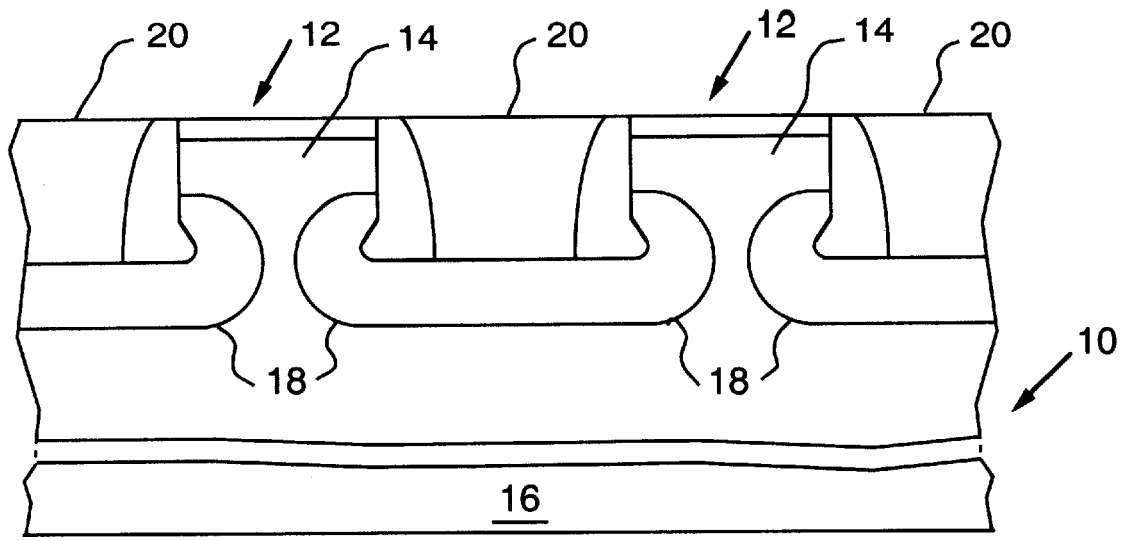
FIG. 1 illustrates a substrate carrying a plurality of partially isolated structures separated by field oxide regions in accordance with the teachings of one embodiment of the present invention.

The present invention, as illustrated in FIG. 1, is comprised of a substrate 10 carrying a plurality of isolated structures 12. The structures 12 are referred to as partially isolated structures because they are comprised of virgin substrate material 14, e.g. silicon, which is partially isolated from the bulk of the substrate material 16 by oxidized regions 18. The invention is described with reference to isolated structures 12 having typical feature sizes for 256 megabit DRAM technology, for example, 0.25 microns by 0.25 microns by 0.15 microns in depth. The invention, however, is not limited to such dimensions, those dimensions are used as an example, and those dimensions are not limitations of the present invention.

Partially isolated structures 12 are isolated from one another by field oxide regions 20. The PN junctions of active devices formed in virgin substrate material 14 will be less leaky because the virgin substrate material 14 is substantially electrically isolated from the bulk of the substrate 16 by virtue of the oxidized regions 18. Also, devices can be fabricated closer together while still providing acceptable operational devices. It should be noted that if the dimensions are sufficiently small, then the structures 12 may become completely isolated. Structures of various sizes may be provided such that some are completely isolated while others are partially isolated. In some applications it may be preferable to provide only partial isolation, because partial isolation still allows the structures 12 to be fabricated close together and also allows for a back bias potential to be electrically applied to the body of the device. The process for fabricating a substrate 10 of the type illustrated in FIG. 1 will now be described.

Figure 2A:
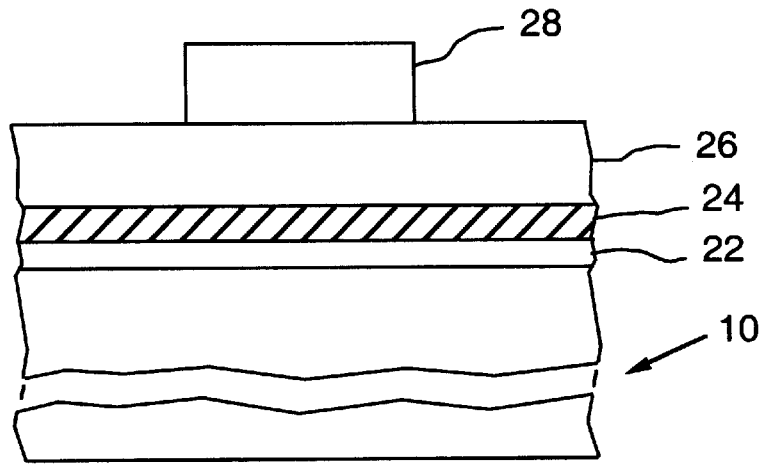
FIG. 2a illustrates a portion of a substrate having an active area island defined on a layer of nitride over a layer of polysilicon over a layer of oxide.
Figure 2B:
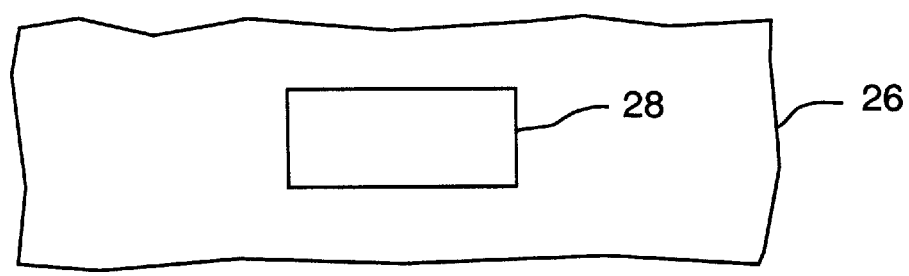

Turning to FIGS. 2a and 2b, the virgin substrate material 10 has a layer of oxide 22 deposited thereon. As used herein, the term deposited is used broadly to mean layers which are not only deposited in the traditional sense, but layers of material which are grown or in any other manner caused to be formed. A layer of polysilicon 24 may be deposited on top of the oxide layer 22 to act as a buffer during subsequent etch steps. Thereafter, a nitride layer 26 is deposited, either on top of the polysilicon layer 24 (if it is present) or on top of the oxide layer 22 (if the polysilicon layer 24 is not present). The layers 24 and 26 may be thought of as material which is provided to protect the oxide layer 22.

A layer of photoresist is deposited on top of the nitride layer 26 and thereafter patterned to leave areas 28 of the photoresist layer on nitride layer 26 as seen best in FIG. 2b. The areas protected by the remnants 28 of the photoresist layer define the planer dimensions, i.e. the x and y dimensions, of what will become the isolated structure 12.

Figure 3:
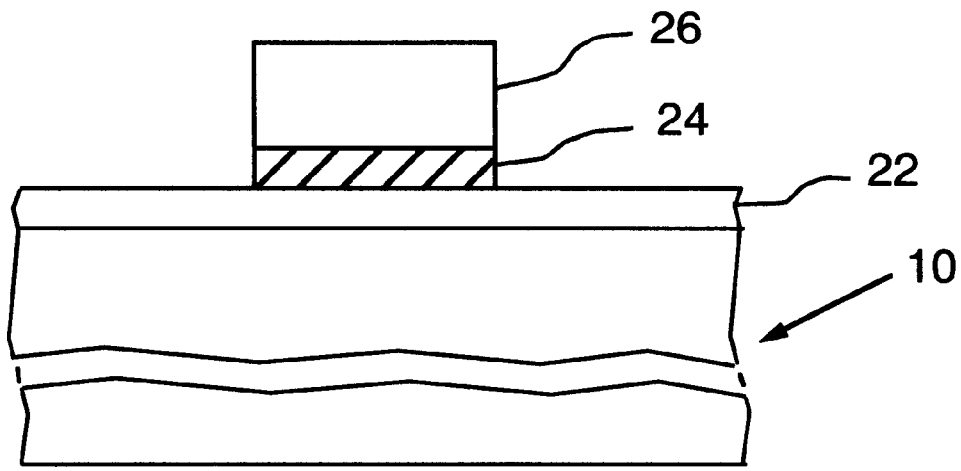
FIG. 3 illustrates the substrate of FIG. 2 etched to the oxide layer and with the photoresist stripped.

In FIG. 3, the nitride layer 26 and polysilicon layer 24 have been etched to the oxide layer 22. Also, the photoresist 28 has been stripped.

Figure 4:
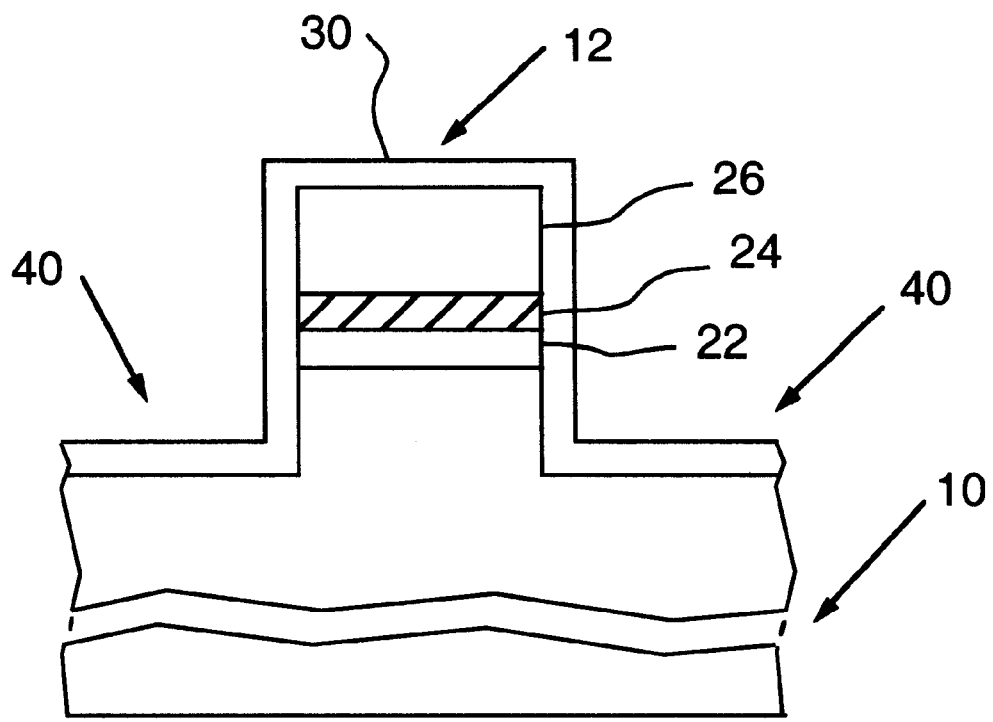
FIG. 4 illustrates the substrate of FIG. 3 with the silicon trenched and a nitride layer deposited thereon.

In FIG. 4, the oxide layer 22 is etched as well as the substrate 10 so as to form a trench 40 completely surrounding the material which will form the partially isolated structure 12. Thereafter, a nitride layer 30 is deposited.

Figure 5:
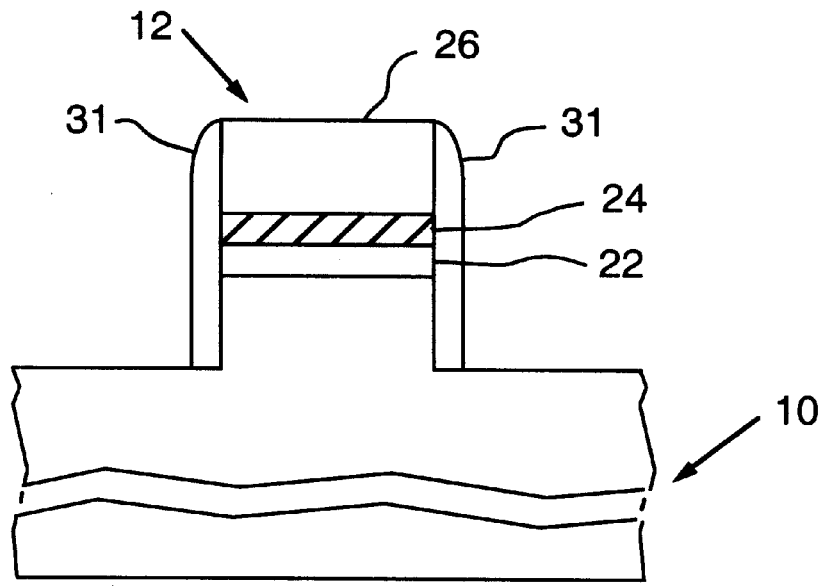
FIG. 5 illustrates the manner in which the nitride layer is etched to create nitride spacers.
Figure 6:
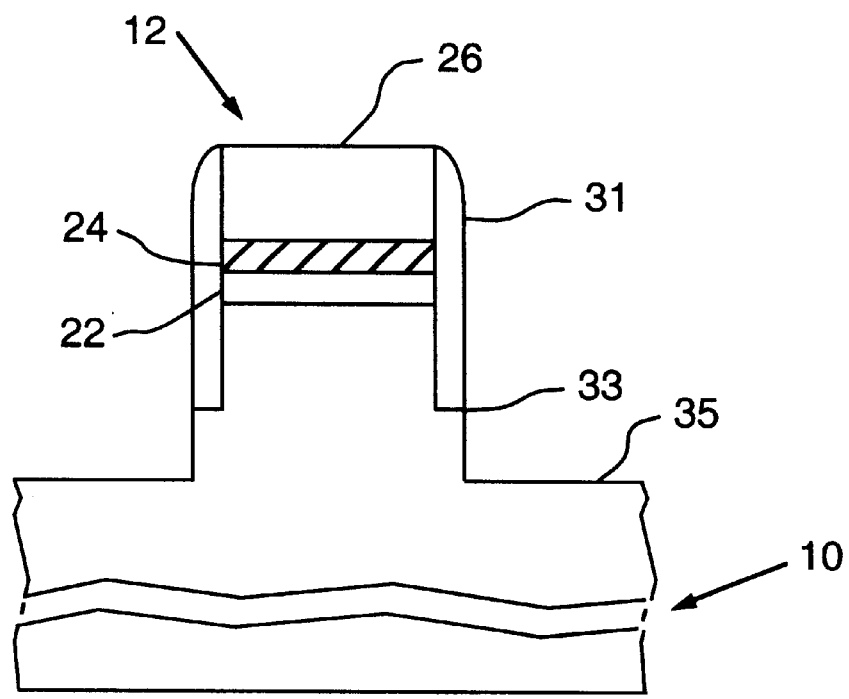
FIG. 6 illustrates the substrate of FIG. 5 wherein the substrate is etched again to a level below the nitride spacers.

Turning to FIG. 5, the nitride layer 30 is etched so that all that remains of the nitride layer 30 is a nitride spacer 31. The reader will recognize that the nitride spacer 31 completely surrounds the area which will become the partially isolated structure 12. Thereafter, the substrate is further etched to deepen the trench 40 to a level below the nitride spacer 31. An anisotropic etch, such as a reactive ion etch, may be used so that the nitride spacer 31 is left supported by a ledge 33 formed in the substrate 10, as shown in FIG. 6. The nitride spacer 31 may have a height on the order of 0.1 to 0.125 microns whereas the distance from the ledge 33 to the bottom 35 of the trench may be on the order of 0.10 to 0.3 microns.

Figure 7A:
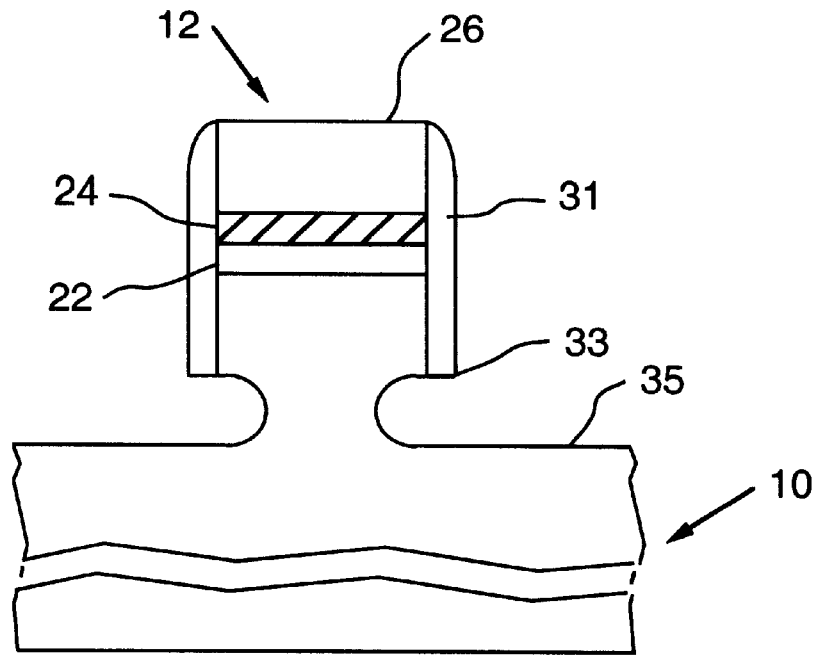
FIGS. 7a and 7b illustrate the substrate of FIG. 5 wherein the substrate is etched again to a level below the nitride spacers and undercutting the nitride spacers.

Alternatively, an isotropic etch may be used to undercut the nitride spacer 31, as shown in FIG. 7a. Undercutting the nitride spacer 31 removes silicon under the active area 26, thereby reducing the amount of oxidation required to isolate or partially isolate the active area 26. That is desirable because oxidation can be a time consuming processing step, particularly if a large volume of silicon must be oxidized. In addition, oxidation tends to create stress in the structure, which may lead to defects and failures. As a result, it is often desirable to minimize the amount of oxidation. The isotropic etch may use a wet chemistry solution, such as either tetromethol ammonia hydroxide (TMAH) or potassium hydroxide. TMAH is desirable because it is very selective, etching silicon and generally not etching the nitride spacer 31. The isotropic etch may also be combined with an anisotropic etch, either before or after the isotropic etch. By using both an isotropic and an anisotropic etch, both the downward etching and the undercutting of the nitride spacer may be varied to suit particular applications.

Figure 7B:
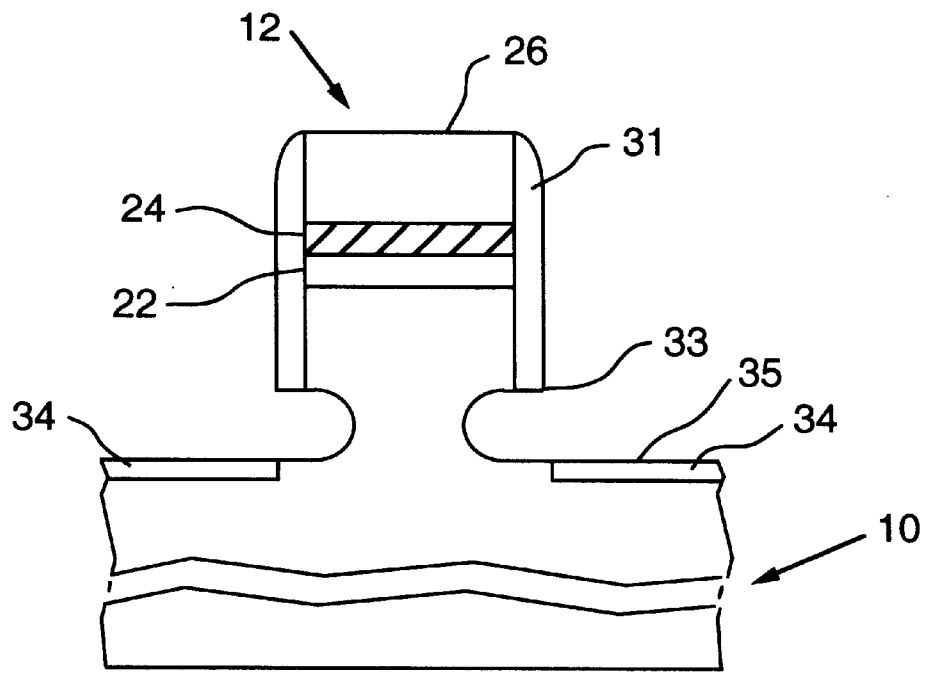

FIG. 7b illustrates an alternative embodiment wherein the trench is deepened below the nitride layer 31 and an oxide layer 34 is formed at the bottom 35 of the trench. Thereafter, a selective, isotropic etch, such as TMAH, may be used to undercut the nitride spacer 31. Further downward etching during the undercut step is prevented by the oxide layer 34. The oxide layer 34 may be formed, for example, by implanting oxygen in the bottom 35 of the trench and then exposing it to a high temperature, thereby forming the oxide layer 34. After undercutting the nitride spacer 31, the oxide layer 34 may be removed or further oxidized by a minifield oxidation, as described hereinbelow.

Figure 8A:
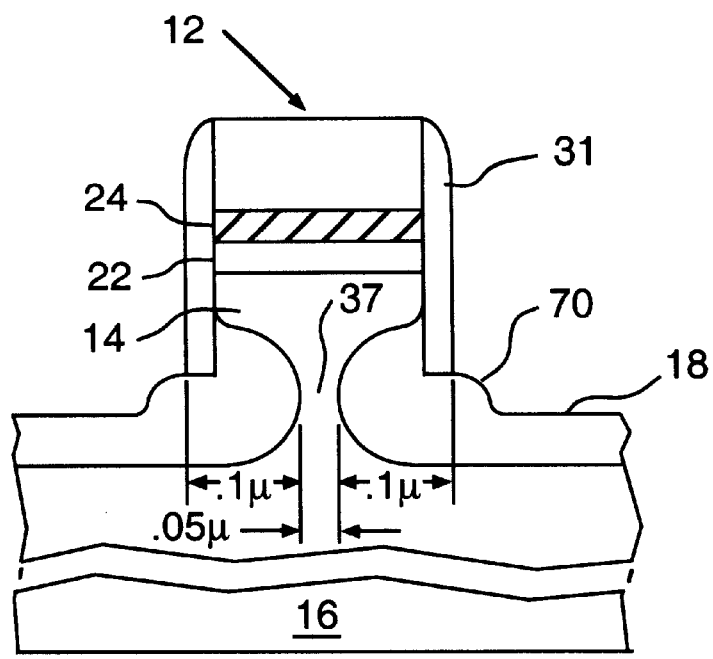
FIGS. 8a and 8b illustrate the substrates of FIGS. 6 and 7a, respectively, with the exposed sidewall silicon being oxidized into the area under the active area and horizontally in the field regions.
Figure 8B:
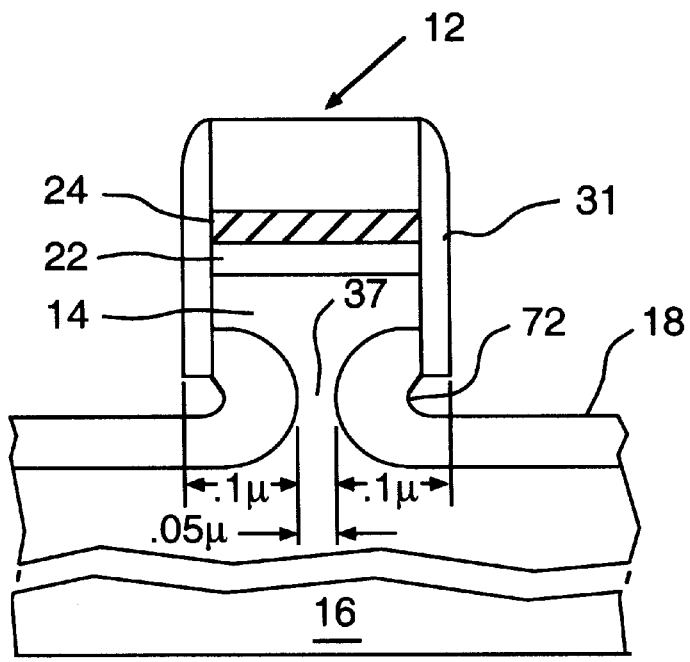

Regardless of the manner of deepening the trench, substrate is exposed below the nitride layer 31. The exposed substrate is then oxidized, preferably using conventional thermal oxidation techniques. The oxidation consumes silicon downward into the substrate, sideways underneath the region which will become the partially isolated structure 12, and upward into the virgin substrate material 14. That oxidation step, which may be referred to as a minifield oxidation step, is precisely controlled to control the amount of virgin substrate material 14 that is consumed. A sufficient volume of virgin substrate material 14 should remain to enable fabrication of active devices. FIG. 8a illustrates oxidation of the structure illustrated in FIG. 6, resulting in curved oxide regions 18 having protrusions 70 therein. FIG. 8b illustrates oxidation of the structure illustrated in FIG. 7a, resulting in a curved oxide regions 18 having recesses 72 therein.

Figure 8C:
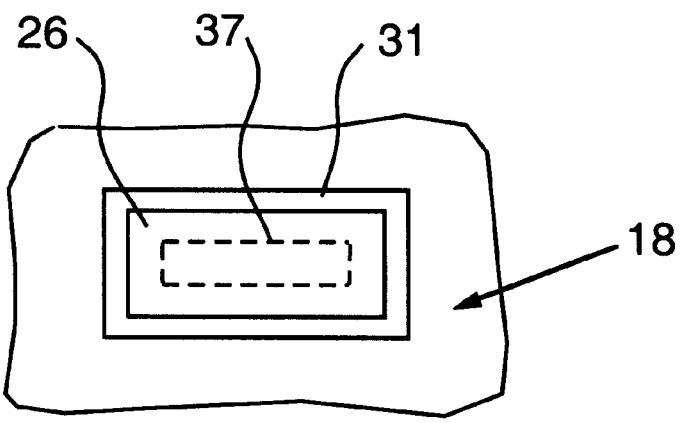
FIG. 8c is a top view looking down onto the portion of the substrate shown in FIGS. 8a and 8b.

The amount of substrate consumed horizontally may, for example, be approximately 0.1 micron on each side of the area 12. That oxidation process leaves a stem 37 connecting the virgin substrate material 14 to the bulk of the substrate 16. The stem is on the order of 0.05 microns by 0.05 microns. It is the minifield oxidation step which causes the virgin substrate material 14 to be partially isolated such that the structure 12 becomes a partially isolated structure. The stem 37 and substrate consumed by the oxidation process under the partially isolated structure 12 may also be seen in FIG. 8c. Oxidation time will depend upon the area of the partially isolated structure 12 and the other parameters. Typical oxidation parameters are as follows: 850°–1100° C., wet ambient or dry $O_2$, and high pressure or atmospheric. For example, 850° C. with wet ambient for a sufficient time to allow 0.1 micron horizontal oxidation under partially isolated areas 12 and 0.1 vertical oxidation in the partially isolated areas 12. High pressure may be used to reduce the time required for oxidation and to reduce the amount of oxide that forms behind the nitride spacer 31. If too much oxide forms behind the spacer 31, it may force the spacer 31 away from the walls of the trench, which may be undesirable in some applications. With a 0.25 micron spacer, the partially isolated areas 12 will be left with an area of virgin substrate material 14 approximately 0.15 microns in depth.

Figure 8D:
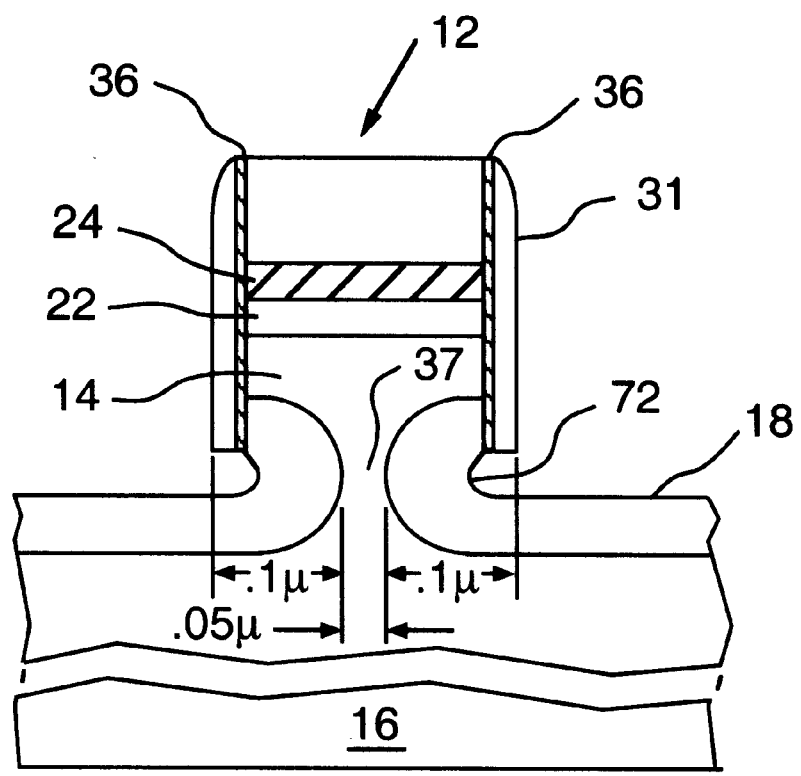
FIG. 8d illustrates the substrate of FIG. 7a including an oxide spacer on the sidewall of the structure and with the exposed sidewall silicon being oxidized into the area under the active area and horizontally in the field regions.

FIG. 8d illustrates an alternative embodiment wherein an oxide layer 36 is formed between the nitride spacer 31 and the sidewall of the structure 12. The oxide layer 36 is a buffer between the nitride spacer 31 and the silicon under the active area 26. The oxide layer 36 reduces stress on the nitride layer 31 that would otherwise be caused by the oxide regions 18. Without the oxide layer 36, the formation of the oxide regions 18 forces the nitride layer 31 outward from the structure 12, thereby stressing it. The oxide layer 36 is formed prior to the nitride spacer 31 and may be formed in a manner similar to the nitride layer. For example, after the first etch a layer of oxide may be formed over the structure, and that layer of oxide may then be anisotropically etched to form the oxide spacer 36 on the sidewall of the structure 12. FIG. 8d illustrates the oxide layer 36 on a structure formed when the nitride layer 31 is undercut, although one of ordinary skill in the art will realize that the oxide layer 36 may also be used with a structure wherein the nitride layer 31 is not undercut. The remaining illustrations do not show the oxide layer 36, although one of ordinary skill in the art will realize that the teachings of the present invention are applicable to a structure 12 including the oxide layer 36.

Figure 9:
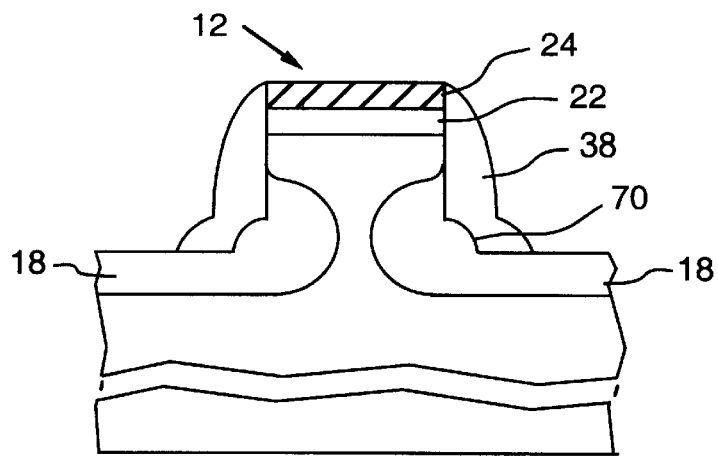
FIG. 9 illustrates the substrate of FIG. 8a with the nitride layer removed and the nitride spacers removed and replaced with oxide spacers.
Figure 10:
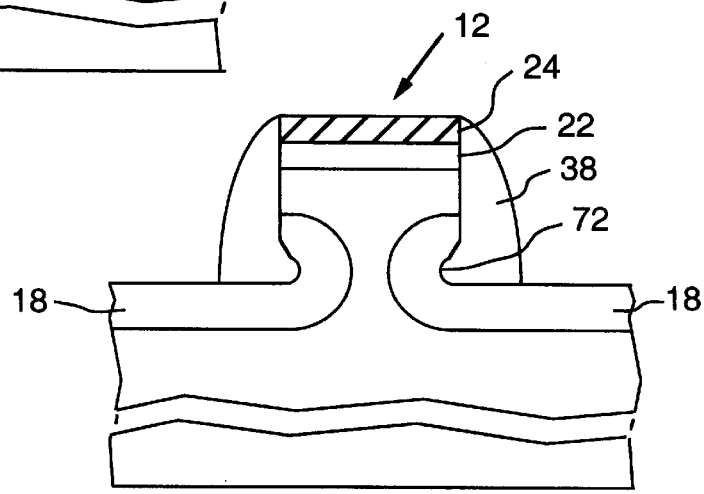
FIG. 10 illustrates the substrate of FIG. 8b with the nitride layer removed and the nitride spacers removed and replaced with oxide spacers.

Turning now to FIGS. 9 and 10, after the minifield oxidation step, the remainder of the nitride layer 26 and the nitride spacers 31 are removed by, for example, a wet etch. If the oxide layer 36 is used (see FIG. 8d), it may be either removed or retained, as its presence will not adversely affect the structure 12. In FIGS. 9 and 10 the oxide layer 36 is not present on the structure 12.

The oxidized regions 18 are curved, either outwardly 70 (FIG. 9) or inwardly 72 (FIG. 10), at the bottom of the partially isolated structure 12. It is desirable to insure that the trench is completely filled in subsequent processing steps, and the curved portions of the oxidized regions 18 can sometimes be difficult to fill. Gaps are problematic because they can house impurities and moisture that may lead to latent defects in the structure 12. For that reason, a layer of TEOS oxide is deposited in a manner so as to fill around the curved portion under the partially isolated structure 12. Thereafter, the TEOS layer is etched so that an oxide spacer 38 is left surrounding the partially isolated structure 12. FIG. 9 illustrates the oxide spacer 38 formed in the structure illustrated in FIG. 8a. FIG. 10 illustrates the oxide spacer 38 formed in the structure illustrated in FIG. 8b.

Figure 11:
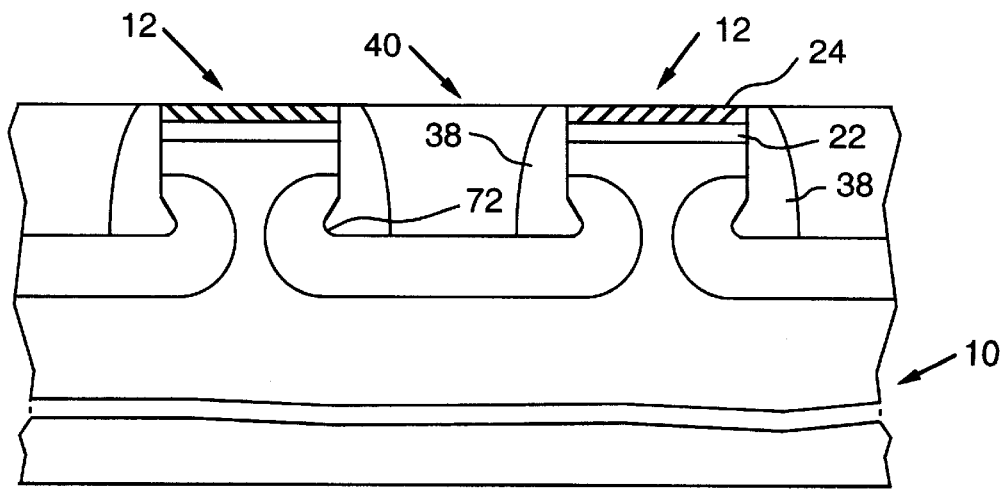
FIG. 11 illustrates a larger area of the substrate of FIG. 9 so that adjacent structures may be seen and wherein the trench separating adjacent structures is filled by oxide.
Figure 12:
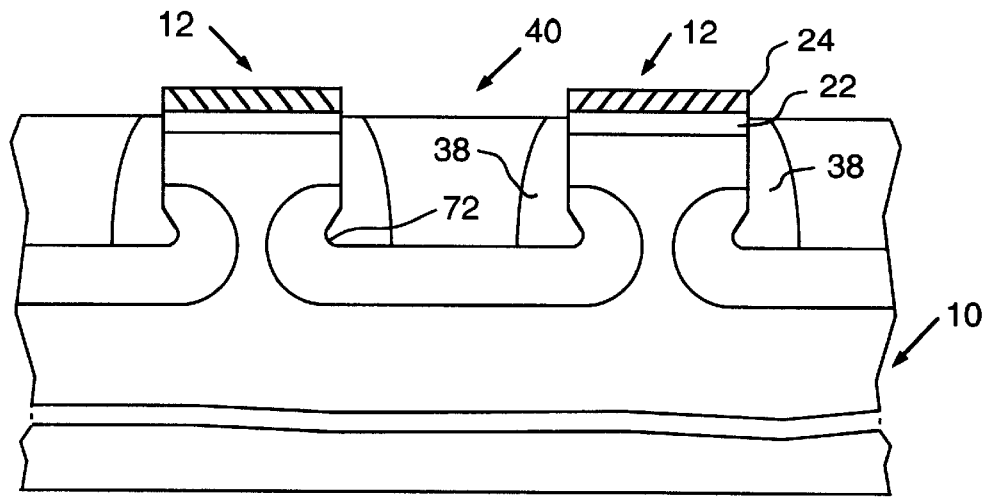
FIG. 12 illustrates the substrate of FIG. 11 wherein the oxide fill is etched to about the level of the surface of the silicon.
Figure 13:
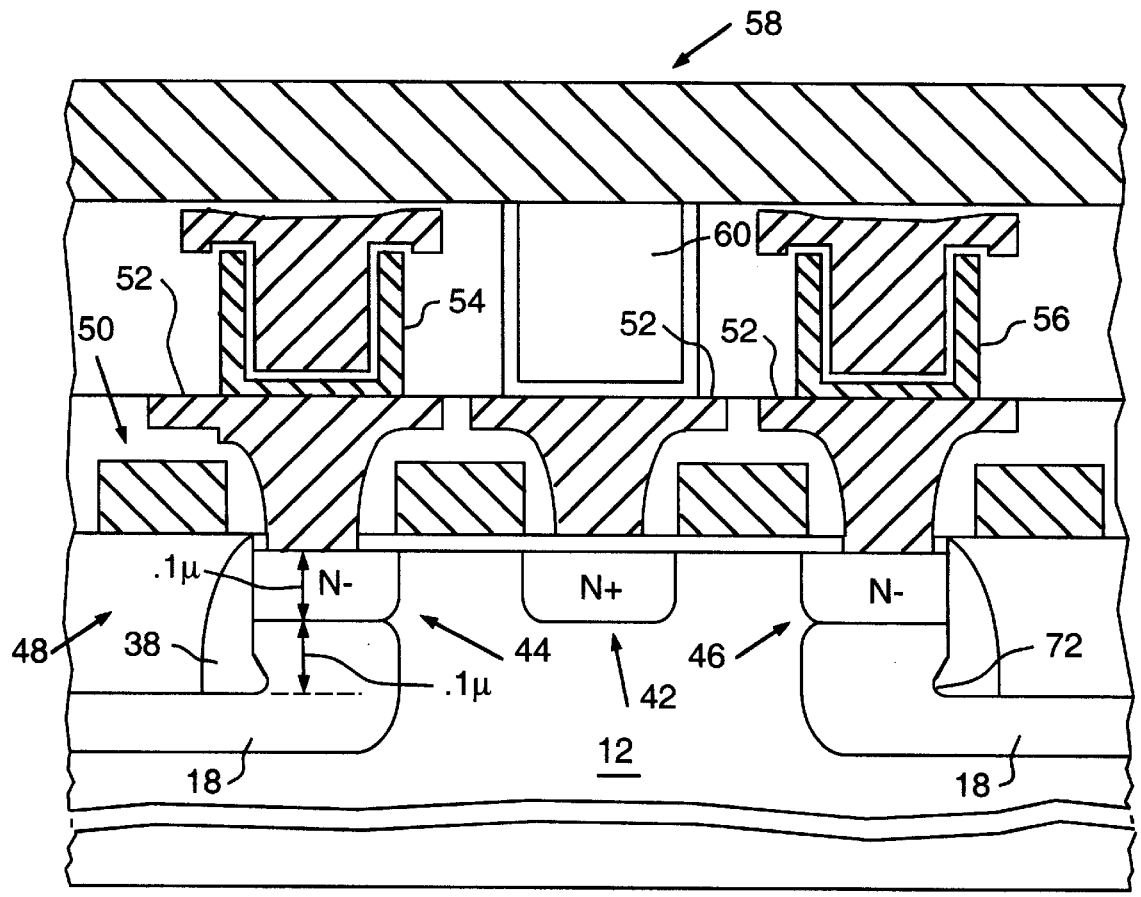
FIG. 13 illustrates a memory cell fabricated on the substrate illustrated in FIG. 12.

FIGS. 11, 12, and 13 illustrate additional processing steps and multiple structures 12 constructed in accordance with the present invention. Those illustrations show structures constructed with an undercut of nitride spacer 31 and without the oxide layer 36. Those of ordinary skill in the art will realize, however, that the teachings associated with FIGS. 11–13 are also applicable to structures 12 constructed from nitride spacers 31 resting on ledge 33 of silicon, as illustrated in FIGS. 6 and 8a, and also to structures including the oxide layer 36.

In FIG. 11, a larger portion of the substrate is illustrated so that adjacent partially isolated structures 12 may be seen. The partially isolated structures 12 are separated by the trench 40. At this point, the trench is filled with a material such as oxide. For example, the substrate 10 may be subjected to an oxide deposition which blankets the substrate 10 filling in the trench 40. Thereafter, the oxide may be etched by a process which stops when the polysilicon layer 24 is reached. There may be a small amount of overetching of the oxide in the area of the trench 40 such that the level of the oxide is slightly lower than the top surface of the polysilicon layer 24.

Turning to FIG. 12, the material filling the trench 40 is etched or planarized so that the top surface of the material in the trench 40 is approximately even with the top surface of the oxide layer 22. Thereafter, the remnants of the polysilicon layer 24 are stripped in a manner so as not to damage the remnants of the oxide layer 22 which results in the structure illustrated in FIG. 1. The remnants of the oxide layer 22 can be used as gate oxide for the fabrication of active devices. Active devices fabricated in partially isolated structure 12 are separated from one another by the field oxide regions 20. The field oxide regions are dimensioned so that partially isolated structure 12 are approximately 0.25 microns from each other. Total isolation between devices on the active areas 12 can be as much as 0.65 microns (0.2 microns, plus 0.25 microns, plus 0.2 microns) for a given 0.25 active area spacing. Furthermore, the field oxide regions are comprised of both thermal oxide and deposited oxide so that the advantages of each type of oxide can be gained.

A portion of the substrate shown in FIG. 1 is also shown in FIG. 13 with two memory cells formed thereon. Active devices in the form of a digitline junction 42 and storage node junctions 44, 46 are formed in partially isolated structure 12. A wordline 50 overlays the oxide 48 which fills trench 40. Storage node junctions 44, 46 are in electrical contact with capacitors 54, 56, respectively, through polyplugs 52. The digitline junction 42 is in electrical contact with a metal digitline 58 through a polyplug 52 and a metal plug 60.

A substrate 10 carrying a plurality of partially isolated structures 12 provides an excellent vehicle for the fabrication of solid state memories such as an SRAM, DRAM, other types of memory, or virtually any type of logic circuit. When used for the fabrication of memories, it is anticipated that the storage node junction for the capacitor will be fabricated in the partially isolated structure 12 as shown in FIG. 13.

While FIG. 13 illustrates one type of device which might be fabricated upon substrate 10, those of ordinary skill in the art will recognize the advantages of fabricating other types of devices. In particular, active devices formed in partially isolated structures 12 will be substantially isolated from the bulk of the substrate 16 thereby eliminating or substantially reducing diode leakage in those areas.

While the present invention has been described in connection with a preferred embodiment thereof, those of ordinary skill in the art will recognize that many modifications and variations may be employed. For example, the sample dimensions and process parameters disclosed herein may be varied and are disclosed for the purpose of illustration and not limitation. The foregoing disclosure and the following claims are intended to cover all such modifications and variations.

What is claimed is:

1. An isolated structure, comprising:
   a substrate;
   an active device formed in said substrate;
   an oxide layer formed in said substrate, defining said active device, and including a curved oxidized region; and
   an oxide spacer adjacent to said active device and formed on the curved oxidized region of said oxide layer.

2. The device of claim 1, wherein said curved oxidized region is a protrusion.

3. The device of claim 1, wherein said curved oxidized region is a recess.

4. A device carrying a plurality of isolated structures, comprising:
   a substrate;
   a plurality of active devices formed in said substrate;
   a plurality of oxide layers formed in said substrate, with each of said oxide layers defining one of said active devices, and with each of said oxide layers including a curved oxidized region; and
   a plurality of oxide spacers, with each of said oxide spacers adjacent to one of said active devices and formed on the curved oxidized region of one of said oxide layers.

5. The device of claim 4, wherein said curved oxidized regions are protrusions.

6. The device of claim 4, wherein said curved oxidized regions are recesses.

7. The substrate of claim 4 further comprising PN junctions fabricated in certain of said isolated structures.

8. The substrate of claim 4 further comprising a memory array carried by said substrate.

9. An isolated structure, comprising:
   a substrate;
   an active device formed in a portion of said substrate;
   an oxide layer formed in said substrate below said active device, said oxide layer defining a stem of unoxidized substrate between the portion of the said substrate in which said active device is formed and a bulk portion of said substrate, and said oxide layer including a curved oxide surface on a side opposite the stem; and
   an oxide spacer adjacent to the curved oxide surface of said oxide layer and defining sides of the portion of said substrate in which said active device is formed.

10. The structure of claim 9, wherein the curved oxide surface of said oxide layer is a protrusion.

11. The structure of claim 9, wherein the curved oxide surface of said oxide layer is a recess.

12. The structure of claim 9, wherein said active area includes at least one PN junction.

13. The structure of claim 12, wherein said active area forms part of a memory device.

14. The structure of claim 9, wherein:
   the curved oxide surface of said oxide layer is a recess; and
   the oxide spacer includes a protrusion corresponding to and engaging the recess of said oxide layer.

15. The structure of claim 9, wherein:
   the curved oxide surface of said oxide layer is a protrusion; and
   the oxide spacer includes a recess corresponding to and engaging the protrusion of said oxide layer.

16. The structure of claim 9, wherein said oxide layer includes the stem is defined by opposing curved surfaces of said oxide layer.

17. The structure of claim 9, further comprising an oxide buffer between said oxide spacer and the portion of said substrate in which said active device is formed.

* * * * *